United States Patent
Khan et al.

(10) Patent No.: US 10,949,214 B2
(45) Date of Patent: Mar. 16, 2021

(54) TECHNOLOGIES FOR EFFICIENT EXIT FROM HYPER DIMENSIONAL SPACE IN THE PRESENCE OF ERRORS

(71) Applicant: Intel Corporation, Santa Clara, CA (US)

(72) Inventors: Jawad B. Khan, Portland, OR (US); Richard Coulson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 136 days.

(21) Appl. No.: 16/370,013

(22) Filed: Mar. 29, 2019

(65) Prior Publication Data

US 2019/0227808 A1 Jul. 25, 2019

(51) Int. Cl.
| | | |
|---|---|---|
| *G06F 12/02* | (2006.01) | |
| *G06F 15/80* | (2006.01) | |
| *G06F 16/33* | (2019.01) | |
| *G06F 16/903* | (2019.01) | |
| *G06F 9/30* | (2018.01) | |
| *G06F 9/38* | (2018.01) | |

(Continued)

(52) U.S. Cl.
CPC ........ *G06F 9/3895* (2013.01); *G06F 9/30036* (2013.01); *G06F 15/8092* (2013.01)

(58) Field of Classification Search
CPC .............. G06F 9/3895; G06F 15/8092; G06F 9/30036; G06F 16/3347; G06F 2212/1016; G06F 16/90339; G06F 12/0207; G06F 2212/454; Y02D 10/00; G11C 11/54; G11C 7/1006
See application file for complete search history.

(56) References Cited

U.S. PATENT DOCUMENTS

| | | | | |
|---|---|---|---|---|
| 8,903,750 B1 * | 12/2014 | Bodkin | .................. | G06N 7/005 706/14 |
| 9,998,596 B1 * | 6/2018 | Dunmire | ............. | H04M 3/5183 |
| 10,078,800 B2 * | 9/2018 | Suri | ....................... | G06N 3/063 |

(Continued)

OTHER PUBLICATIONS

Erwin W. Baumann et al., "Stochastic associative memory", Aug. 19, 1993, pp. 1-9, https://www.spiedigitallibrary.org/proceedings/Download?fullDOI=10.1117%2F12.152629 (Year: 1993).*

(Continued)

*Primary Examiner* — Christopher D Birkhimer
(74) *Attorney, Agent, or Firm* — Compass IP Law PC

(57) ABSTRACT

Technologies for performing hyper-dimensional operations in memory includes a device with a memory media and a memory controller. The memory controller is configured to receive a query from a requestor and determine, in response to receiving the query, a reference hyper-dimensional vector associated with the query. The memory controller is further configured to perform a nearest neighbor search by searching columns of a stochastic associative array in the memory media to determine a number of matching bit values for each row relative to the reference hyper-dimensional vector, wherein each bit in a column of the stochastic associative array represents a bit value of a corresponding row, identify a closest matching row that has a highest number of matching bit values, and output data of the closest matching row.

20 Claims, 7 Drawing Sheets

(51) Int. Cl.
 G11C 11/54 (2006.01)
 G11C 7/10 (2006.01)

(56) References Cited

U.S. PATENT DOCUMENTS

| | | | |
|---|---|---|---|
| 10,180,808 B2 * | 1/2019 | Li | G06F 3/0647 |
| 2018/0122456 A1 * | 5/2018 | Li | G11C 7/1012 |
| 2018/0167504 A1 * | 6/2018 | Dunmire | H04M 3/5183 |
| 2018/0212837 A1 * | 7/2018 | Kalluri | G06Q 30/0202 |
| 2018/0247354 A1 * | 8/2018 | Pratt | H04L 47/10 |
| 2018/0285772 A1 * | 10/2018 | Gopalan | G06N 7/005 |
| 2018/0295237 A1 * | 10/2018 | Dunmire | H04M 3/5183 |
| 2018/0314982 A1 * | 11/2018 | Gopalan | G06N 20/10 |

OTHER PUBLICATIONS

Pentti Kanerva, "Hyperdimensional Computing: An Introduction to Computing in Distributed Representation with High-Dimensional Random Vectors", 2009, pp. 1-21, http://rctn.org/vs265/kanerva09-hyperdimensional.pdf (Year: 2009).*

* cited by examiner

TECHNOLOGIES FOR EFFICIENT EXIT FROM HYPER DIMENSIONAL SPACE IN THE PRESENCE OF ERRORS

BACKGROUND

Generally, performing calculations in hyper-dimensional space involves hyper-dimensional vectors, which are about 10,000 bits in length. For each word, rather than translating a word into ASCII or enumerated symbols, a system randomly creates a 10,000 bit value with a mixture of zeros and ones, called a hypervector. For example, during a hyper-dimensional operation, hyper-dimensional vectors for a key and a value are bound together by performing bitwise XOR. Typically, to perform a hyper-dimensional operation, a processor of a compute device generates hyper-dimensional vectors for a key and a value in a memory, transfers the hyper-dimensional vectors from the memory to the processor, performs the hyper-dimensional operation, and transfers the resulted hyper-dimensional vector back to the memory to be stored. This process is energy and performance inefficient.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
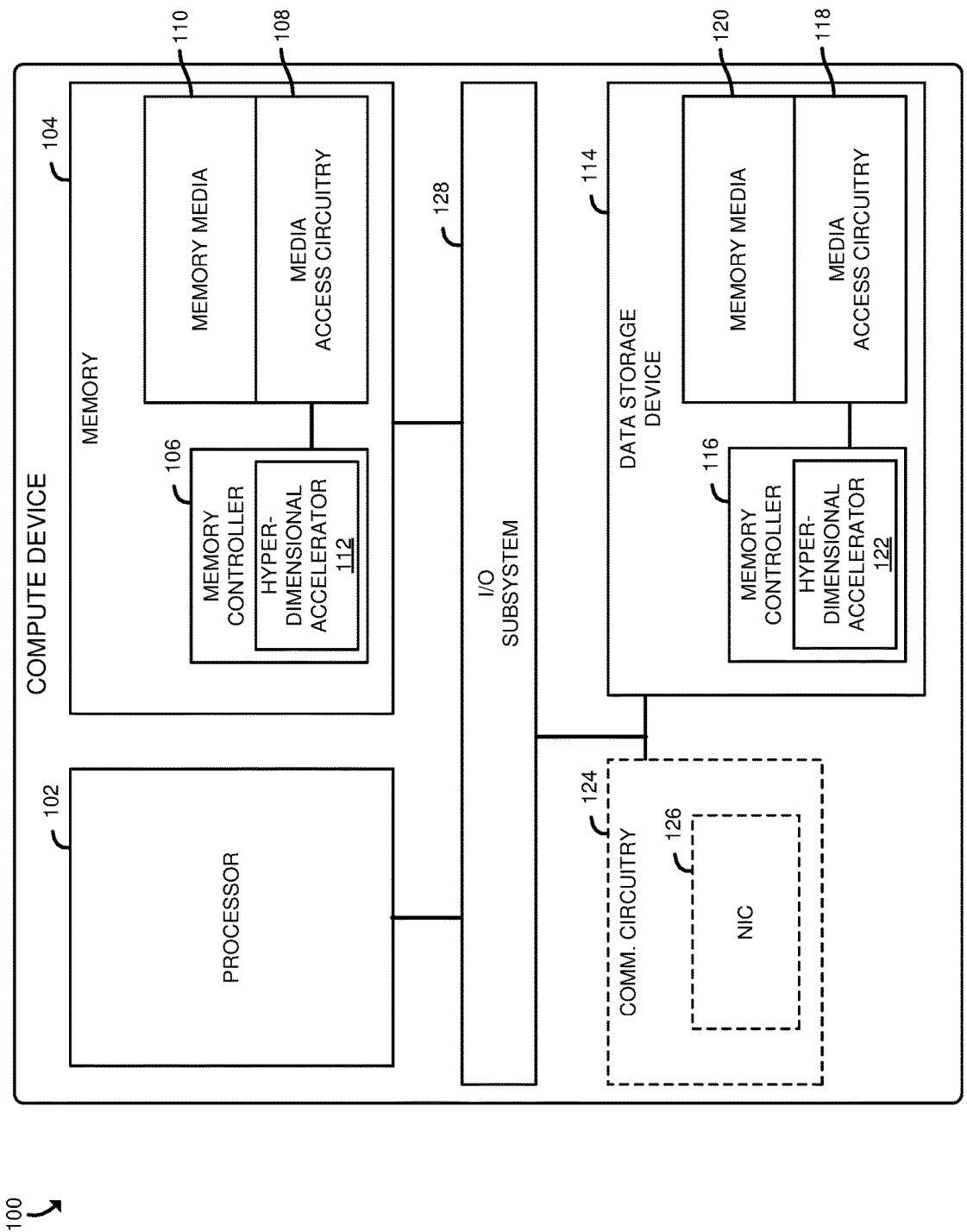
FIG. 1 is a simplified diagram of at least one embodiment of a compute device for performing a hyper-dimensional operation in a memory of the compute device.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, a compute device 100 for performing hyper-dimensional operations and stochastic associative search operations directly in a memory includes a processor 102, a memory 104, an input/output (I/O) subsystem 128, a data storage device 114, and communication circuitry 124. It should be appreciated that, in other embodiments, the compute device 100 may include other or additional components, such as those commonly found in a computer (e.g., a display, peripheral devices, etc.). Additionally, in some embodiments, one or more of the illustrative components may be incorporated in, or otherwise form a portion of, another component. As described herein, the compute device 100, and in particular, the memory 104 of the compute device 100 provides efficient access to selected rows and/or columns of data in the memory (e.g., writing to only the data within a specified column of a matrix, reading from only the data within the specified column, etc.).

Further, the compute device 100, in the illustrative embodiment, is configured to perform operations supporting hyper-dimensional primitives (e.g., bind, permute, or threshold) directly in the memory 104. To do so, the compute device 100 may generate hyper-dimensional vectors, which are about 10,000 bit values, associated with a key and a value. For example, if a key "Mexico" is related to a question "what is the currency of Mexico?" then a value associated to the key is "peso." In such an example, the compute device 100 may generate a random 10,000 bit vector associated with each of the key and the value, rather than translating the key and the value into ASCII or enumerated symbols. In the illustrative embodiment, the compute device 100 may bind (e.g., bitwise XOR operation) the hyper-dimensional key and the hyper-dimensional value directly in the memory 104 to generate a bound hyper-dimensional vector that may be used for future lookup operations by the key or value. Because the key and the value are bound together, this allows the artificial intelligence applications to interpret the following questions to have the same meaning: "what is the currency of Mexico?" or "what is the dollar of Mexico?" By supporting the hyper-dimensional primitives in the memory 104, this obviates the need to transfer 10,000 bits of hyper-dimensional vectors from the memory 104 to the processor 102 to perform a hyper-dimensional operation. As a result, the system 100 may reduce power consumption and increase performance efficiency over typical systems. It should be understood that the memory of the data storage device 114 may additionally or alternatively include and perform similar features as the memory 104.

A hyper-dimensional operation theoretically introduces its own errors. As such, it is difficult to map data back to its original word (e.g., ASCII) after performing the hyper-dimensional mathematical operations. Referring back to the example above, the answer may not be mapped to a word "peso" because of the error introduced during the operation. Additionally, a hash function cannot be used because of the errors in the data. To remove the errors, the data, in the illustrative embodiment, is cleaned with a nearest neighbor search in the memory 104, instead of a linear search, to exit from the hyper-dimensional space to a lower dimensional space. To do so, the memory controller 106 may perform a stochastic associative search in which the memory controller 106 identifies a row that most closely matches (e.g., an inexact match) a reference hyper-dimensional vector using the ability to address (e.g., read the values of) each column of the memory 104 individually. In identifying the closest match, the memory controller 106 may determine which row in a set of rows to be compared to the reference hyper-dimensional vector, has the greatest number of matching values to the reference hyper-dimensional vector (e.g., the reference data set has a 1 as the first bit, and the row also contains a 1 as the first bit, the reference data set has a 0 as the second bit and the row also contains a 0 as the second bit, etc.). In doing so, rather than comparing the entire reference hyper-dimensional vector to the entirety of the column values for each row in the set of rows to be searched, the memory controller 106 may compare only a subset of the column values to the reference hyper-dimensional vector. In performing the search, the memory controller 106 may perform a stochastic search on sparse data (e.g., only 10% of the bits are set to 1), a stochastic search on dense data (e.g., 50% of the bits are 1 and 50% of the bits are 0), or a field search within a vector (e.g., a specific section of a larger data structure). As such, the memory 104 provides functionality similar to that of a content addressable memory (CAM), but at a much lower cost than the CAM (due to differences in manufacturing costs) and, unlike a content addressable memory, provides the ability to identify a closest match, rather than only being able to identify an exact match. The ability to identify the closest inexact match is one of the key features to enable machine learning operations (e.g., in a memory-augmented neural network).

The processor 102 may be embodied as any device or circuitry (e.g., a multi-core processor(s), a microcontroller, or other processor or processing/controlling circuit) capable of executing a workload (e.g., a set of operations, such as an application that may produce requests to read from and/or write to sections of memory, such as selected columns and/or rows of data in a matrix, and/or send a request to the memory 104 to perform an in-memory hyper-dimensional operation or a stochastic associative search on the bit-addressable memory 104), and/or performing other operations described herein. In some embodiments, the processor 102 may be embodied as, include, or be coupled to a field-programmable gate array (FPGA), an application specific integrated circuit (ASIC), reconfigurable hardware or hardware circuitry, or other specialized hardware to facilitate performance of the functions described herein.

The memory 104, which may include a non-volatile memory (e.g., a far memory in a two-level memory scheme), includes a memory media 110, media access circuitry 108 (e.g., a device or circuitry, such as integrated circuitry constructed from complementary metal-oxide-semiconductors (CMOS) or other materials) underneath the memory media 110. The media access circuitry 108 is also connected to a memory controller 106, which may be embodied as any device or circuitry (e.g., a processor, a co-processor, dedicated circuitry, etc.) configured to selectively read from and/or write to the memory media 110 (e.g., in response to requests from the processor 102, which may be executing an application seeking to read from or write to the memory media 110). In some embodiments, the memory controller 106 is included in the same die as the media access circuitry 108. In other embodiments, the memory controller 106 may be on a separate die but in the same package as the media access circuitry 108. In yet other embodiments, the memory controller 106 may be in a separate die and separate package but on the same dual in-line memory module (DIMM) or board as the media access circuitry 108. Similarly, in some embodiments, the media access circuitry 108 may be included in the same die as the memory media 110. In other embodiments, the media access circuitry 108 may be on a separate die but in the same package as the memory media 110. In yet other embodiments, the media access circuitry 108 may be in a separate die and separate package but on the same dual in-line memory module (DIMM) or board as the memory media 110.

Additionally, in the illustrative embodiments, the memory controller 106 further includes a hyper-dimensional accelerator 112, which may be embodied as any device or circuitry (e.g., a processor, a co-processor, dedicated circuitry, etc.) configured to generate hyper-dimensional vectors for a key and a value associated with the key, perform hyper-dimensional operations on the hyper-dimensional vectors, and write the hyper-dimensional vectors and resulting data (e.g., the result of a hyper-dimensional operation) to the memory media 110. The hyper-dimensional accelerator 112 may further be configured to receive a query from a requestor (e.g., the processor 102), determine a reference hyper-dimensional vector associated with the query, and perform a nearest neighbor search to determine a closest matching value to the reference hyper-dimensional vector in the memory 104. Specifically, in the illustrative embodiment, hyper-dimensional accelerator 112 may search columns of a stochastic associative array in the memory 104 for a matching bit value relative to a corresponding bit of the hyper-dimensional vector to identify a value with a highest number of matching values (i.e., a shortest hamming distance).

In the illustrative embodiment, the memory media 110 includes a set of tiles (e.g., each an addressable section of the memory media 110 capable of retaining data) arranged in a cross point architecture (e.g., an architecture in which memory cells sit at the intersection of word lines and bit lines and are individually addressable and in which bit storage is based on a change in bulk resistance), in which each tile is addressable by an x parameter and a y parameter (e.g., a column and a row). A set of tiles form a partition and multiple partitions may be stacked to form a three-dimensional cross point architecture (e.g., Intel 3D XPoint™ memory). Unlike typical memory devices, in which only fixed-size multiple-bit data structures (e.g., byte, words, etc.) are addressable, the media access circuitry 108 is configured to read individual bits, or other units of data, from the memory media 110 at the request of the memory controller 106, which may produce the request in response to receiving a corresponding request from the processor 102.

The non-volatile memory may be embodied as any type of data storage capable of storing data in a persistent manner (even if power is interrupted to non-volatile memory). For example, in some embodiments, the non-volatile memory may be embodied as one or more non-volatile memory devices. The non-volatile memory devices of the non-volatile memory include one or more memory devices configured in a cross-point architecture that enables bit-level addressability (e.g., the ability to read from and/or write to individual bits of data, rather than bytes or other larger units of data), and are illustratively embodied as three-dimensional (3D) crosspoint memory. In some embodiments, the non-volatile memory may additionally include other types of memory, including any combination of memory devices that use chalcogenide phase change material (e.g., chalcogenide glass), ferroelectric transistor random-access memory (FeTRAM), nanowire-based non-volatile memory, phase change memory (PCM), memory that incorporates memristor technology, Magnetoresistive random-access memory (MRAM) or Spin Transfer Torque (STT)-MRAM.

The processor 102 and the memory 104 are communicatively coupled to other components of the compute device 100 via the I/O subsystem 128, which may be embodied as circuitry and/or components to facilitate input/output operations with the processor 102 and/or the main memory 104 and other components of the compute device 100. For example, the I/O subsystem 128 may be embodied as, or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate the input/output operations. In some embodiments, the I/O subsystem 128 may form a portion of a system-on-a-chip (SoC) and be incorporated, along with one or more of the processor 102, the main memory 104, and other components of the compute device 100, in a single chip.

The data storage device 114, may be embodied as any type of device configured for short-term or long-term storage of data such as, for example, memory devices and circuits, memory cards, hard disk drives, solid-state drives, or other data storage device. In the illustrative embodiment, the data storage device 114 includes a memory controller 116, similar to the memory controller 106, media access circuitry 118, similar to the media access circuitry 108, memory media 120, similar to the memory media 110, and a hyper-dimensional accelerator 122, similar to the hyper-dimensional accelerator 112. As such, in the illustrative embodiment, the data storage device 114 is capable of performing a set of in-memory compute operations, using a hyper-dimensional accelerator 122 between the media access circuitry 118 and the memory media 120. The data storage device 114 may include a system partition that stores data and firmware code for the data storage device 114 and one or more operating system partitions that store data files and executables for operating systems.

The communication circuitry 124 may be embodied as any communication circuit, device, or collection thereof, capable of enabling communications over a network between the compute device 100 and another device. The communication circuitry 124 may be configured to use any one or more communication technology (e.g., wired or wireless communications) and associated protocols (e.g., Ethernet, Bluetooth®, Wi-Fi®, WiMAX, etc.) to effect such communication.

The illustrative communication circuitry 124 includes a network interface controller (NIC) 126, which may also be referred to as a host fabric interface (HFI). The NIC 126 may be embodied as one or more add-in-boards, daughter cards, network interface cards, controller chips, chipsets, or other devices that may be used by the compute device 100 to connect with another compute device. In some embodiments, the NIC 126 may be embodied as part of a system-on-a-chip (SoC) that includes one or more processors, or included on a multichip package that also contains one or more processors. In some embodiments, the NIC 126 may include a local processor (not shown) and/or a local memory (not shown) that are both local to the NIC 126. In such embodiments, the local processor of the NIC 126 may be capable of performing one or more of the functions of the processor 102. Additionally or alternatively, in such embodiments, the local memory of the NIC 126 may be integrated into one or more components of the compute device 100 at the board level, socket level, chip level, and/or other levels.

Figure 2:
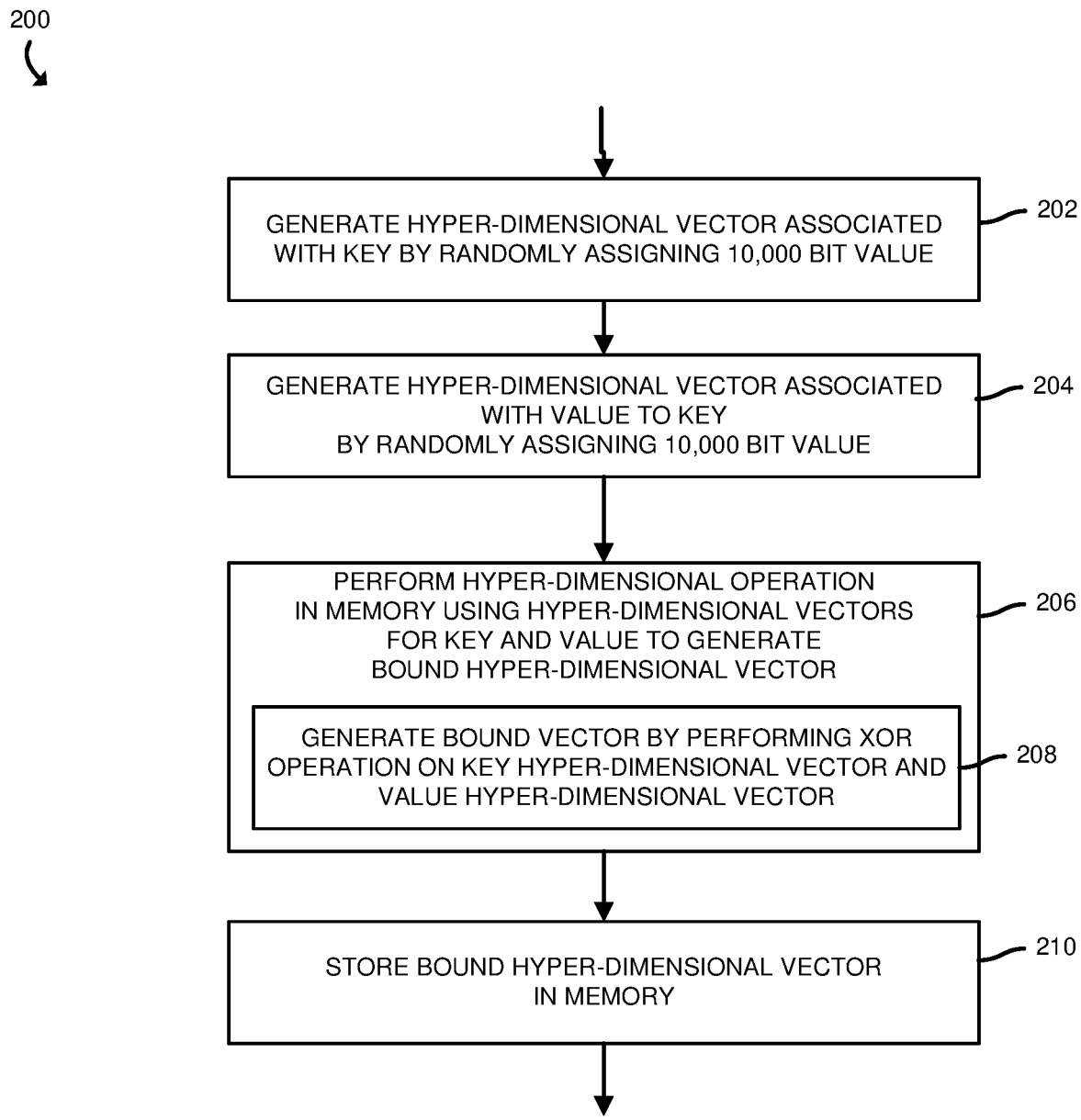
FIG. 2 is a simplified flow diagram of at least one embodiment of a method for performing a hyper-dimensional operation in the memory that may be performed by the memory of the compute device of FIG. 1.

Referring now to FIG. 2, the hyper-dimensional accelerator 112 of the compute device 100, in operation, may execute a method 200 for performing a hyper-dimensional operation in the memory 104. The method 200 is described with reference to the memory 104. However, it should be understood that the method 200 could be additionally or alternatively performed using the memory of the data storage device 114. The method 200 begins with block 202, in which the hyper-dimensional accelerator 112 of the memory 104 generates a hyper-dimensional vector associated with a key by randomly assigning a 10,000 bit value. Subsequently or concurrently, in block 204, the hyper-dimensional accelerator 112 of the memory 104 generates a hyper-dimensional vector associated with a value to the key by randomly assigning a 10,000 bit value. For example, if a key "Mexico" is related to a question "what is the currency of Mexico?" then a value to the key is "peso." In such an example, the compute device 100 may generate a random 10,000 bit vector to the key and the value, rather than translating the key and the value into ASCII or enumerated symbols.

In block 206, the hyper-dimensional accelerator 112 performs a hyper-dimensional operation in the memory 104 using the hyper-dimensional vectors associated with the key and the value to generate a bound hyper-dimensional vector. To do so, in block 208, the hyper-dimensional accelerator 112 generates a bound hyper-dimensional vector by performing a bitwise XOR operation on the hyper-dimensional vectors for the key and the value. It should be appreciated that, in some embodiments, further bitwise operations may be performed to generate a bound hyper-dimensional vector associated with the key and the value.

Subsequently, in block 210, the hyper-dimensional accelerator 112 stores the bound hyper-dimensional vector in the memory 104. For example, the bound hyper-dimensional vector stored in the memory 104 may be used during machine learning operations to look for the associated key or value. It should be appreciated that, although the method 200 is described as being executed by the hyper-dimensional accelerator 112, any component of the memory 104 may perform the method 200.

Figure 3:
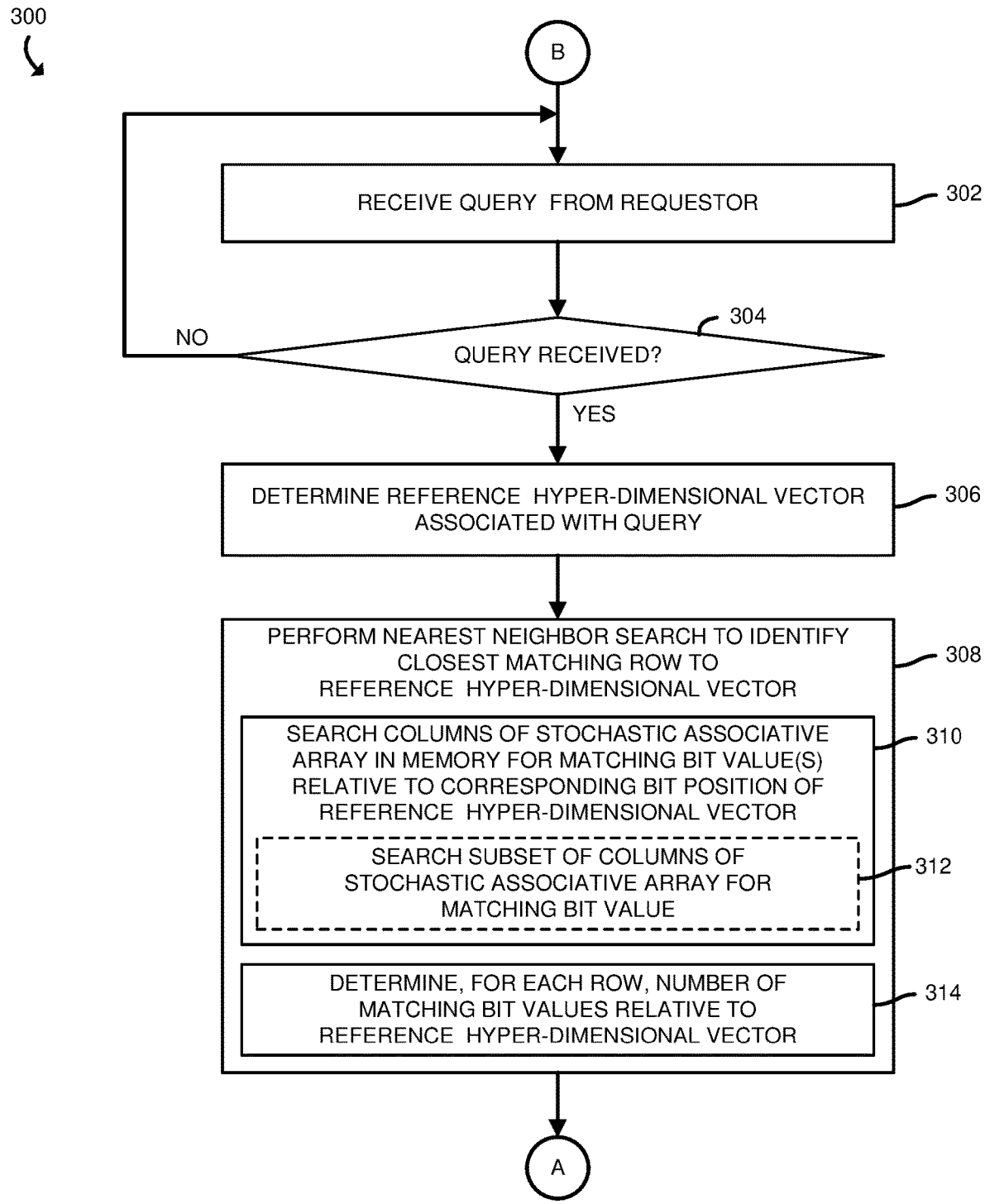
FIGS. 3 and 4 are a simplified flow diagram of at least one embodiment of a method for performing a nearest neighbor search to determine closest matching data in memory relative to a reference hyper-dimensional vector that may be performed by the memory of the compute device of FIG. 1.

Referring now to FIG. 3, the hyper-dimensional accelerator 112 of the compute device 100, in operation, may execute a method 300 for performing a nearest neighbor search to determine closest matching data in memory relative to a reference hyper-dimensional vector. The method 300 is described with reference to the memory 104. However, it should be understood that the method 300 could be additionally or alternatively performed using the memory of the data storage device 114. The method 300 begins with block 302, in which the hyper-dimensional accelerator 112 receives a query from a requestor. For example, the hyper-dimensional accelerator 112 may receive a request from the processor 102, which may be executing an application seeking to have machine learning operations performed on data stored in the memory media 110. In block 304, if the hyper-dimensional accelerator 112 determines that a query has not been received, the method 300 loops back to block 302 to continue to await a query. If, however, the hyper-dimensional accelerator 112 determines that a query has been received, the method 300 advances to block 306.

In block 306, the hyper-dimensional accelerator 112 determines a reference hyper-dimensional vector associated with the query. In some embodiments, the query itself may include a reference hyper-dimensional vector. In other embodiments, the query may include a memory address of a reference hyper-dimensional vector in the memory 104. In such embodiments, the hyper-dimensional accelerator 112 may obtain the reference hyper-dimensional vector associated with the query.

Figure 6:
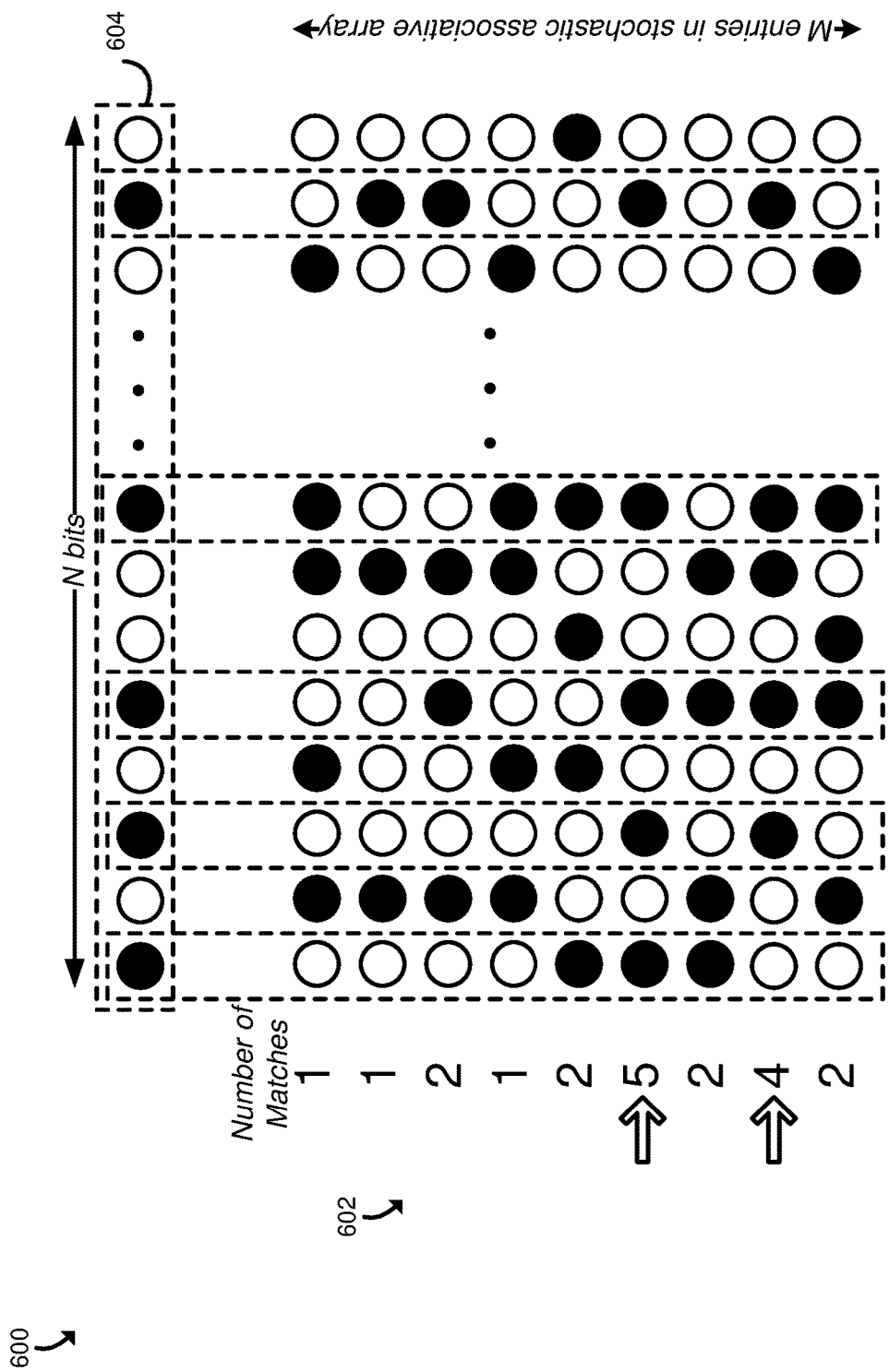
FIGS. 6 and 7 are simplified conceptual diagrams of examples of performing a stochastic associative search on memory.
Figure 7:
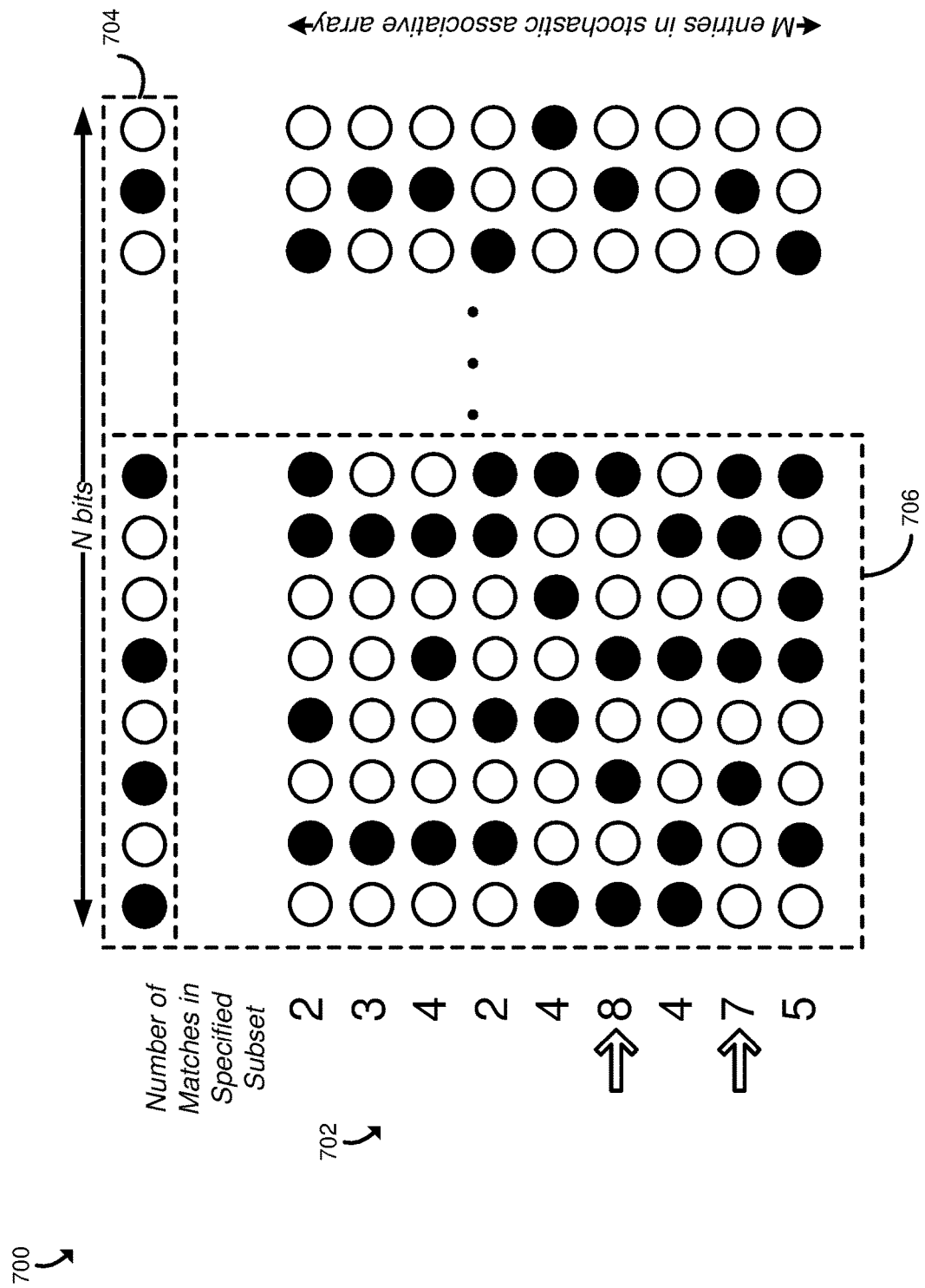

Once the reference hyper-dimensional vector is determined or obtained, the hyper-dimensional accelerator 112 performs a nearest neighbor search to identify a closest matching row to the reference hyper-dimensional vector as indicated in block 308. To do so, the hyper-dimensional accelerator 112 searches columns of a stochastic associated array in the memory 104 for matching bit values relative to the corresponding bit position of the reference hyper-dimensional vector (e.g., the reference hyper-dimensional vector has a 1 as the first bit, and the row also contains a 1 as the first bit, the reference hyper-dimensional vector has a 0 as the second bit and the row also contains a 0 as the second bit, etc.). In other words, the hyper-dimensional accelerator 112 determines which row in a set of rows of the stochastic associated array to be compared to the reference hyper-dimensional vector has the greatest number of matching bit values to the reference hyper-dimensional vector, as illustrated in FIG. 6. In some embodiments, in block 312, the hyper-dimensional accelerator 112 may compare only a subset of the column values to the reference hyper-dimensional vector, rather than comparing the entire reference hyper-dimensional vector to the entirety of the column values for each row in the set of rows to be searched, as illustrated in FIG. 7. In block 314, the hyper-dimensional accelerator 112 determines, for each row, a number of matching bit values relative to the reference hyper-dimensional vector.

Figure 4:
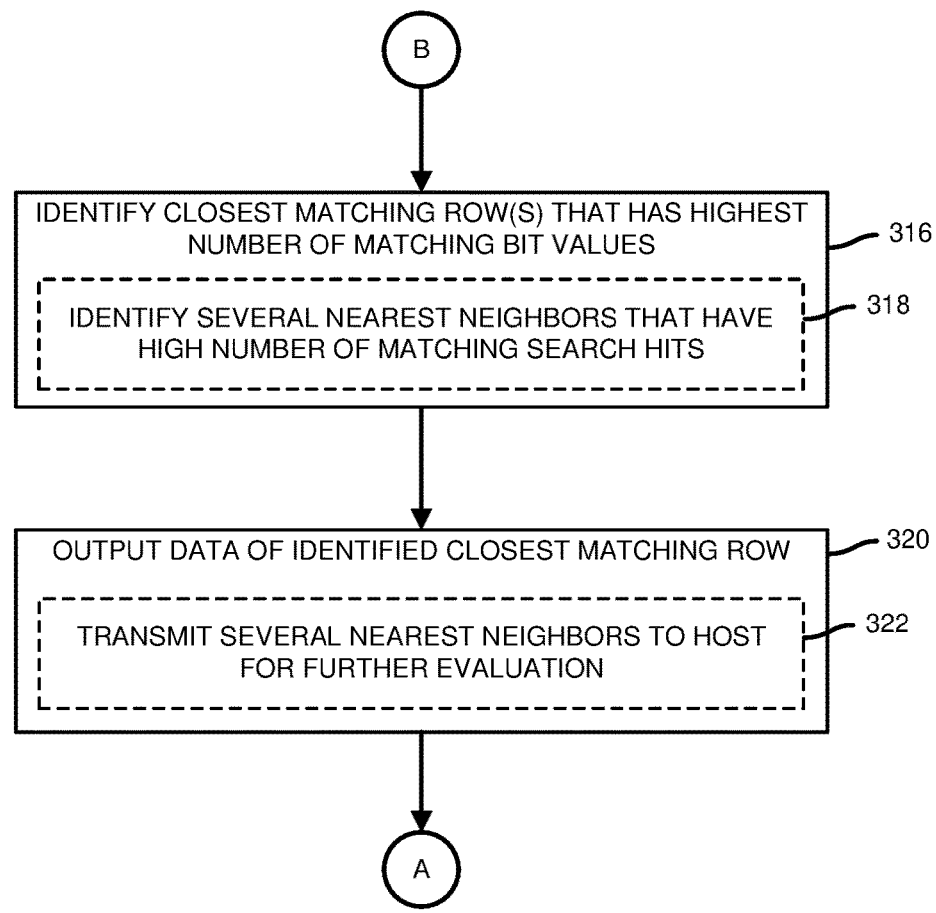

Subsequently, in block 316 of FIG. 4, the hyper-dimensional accelerator 112 identifies the closest matching row that has the highest number of matching bit values (i.e., a shortest hamming distance) relative to the reference hyper-dimensional vector. In some embodiments, the hyper-dimensional accelerator 112 may identify several nearest neighbors that have a relatively high number of matching bit values as indicated in block 318. For example, the hyper-dimensional accelerator 112 may identify the nearest neighbors that have matching bit values exceeding a predefined threshold number.

In block 320, the hyper-dimensional accelerator 112 outputs data of the identified closest matching row. In some embodiments, the hyper-dimensional accelerator 112 may transmit the several nearest neighbors identified in block 318 to the host for further evaluation as indicated in block 322. Subsequently, the method 300 loops back to block 302 to continue await for another query from a requestor. It should be appreciated that the ability to identify the closest inexact match is one of key features to enable approximate nearest neighbor search or similarity search. It should also be appreciated that, although the method 300 is described as being executed by the hyper-dimensional accelerator 112, any component of the memory 104 may perform the method 300.

Figure 5:
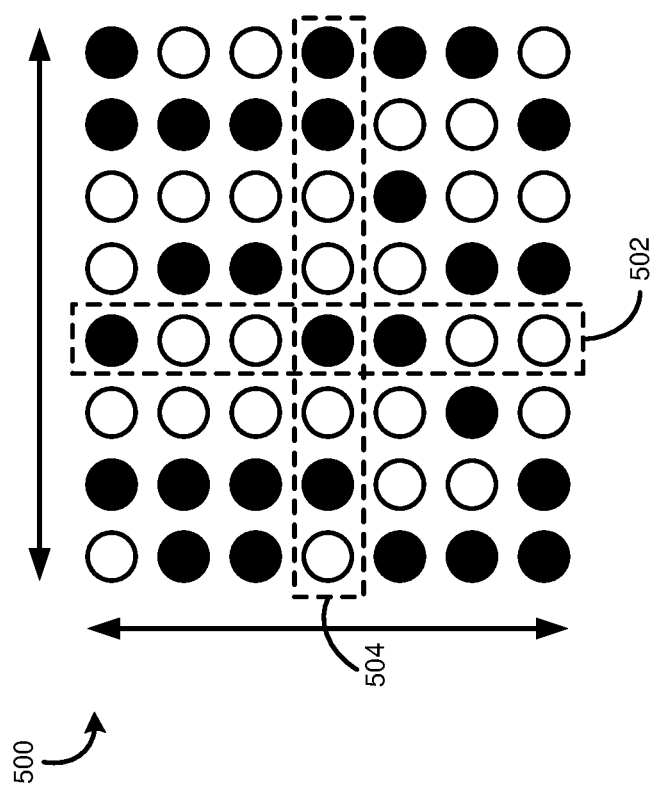
FIG. 5 is a simplified conceptual diagram of at least one embodiment of a memory matrix providing row- and column-major bit addressability in which a stochastic associative search operation may be performed.

Referring now to FIG. 5, a conceptual diagram 500 of a matrix of data including multiple rows and multiple columns of data, in which particular rows and/or columns may be selected for access (e.g., read and/or write) is shown. As discussed above, the memory 104 may be arranged in a three-dimensional cross point architecture (e.g., Intel 3D XPoint™ memory), which uses bit-addressable tiles, instead of using word-lines and bit-lines for page data. In the matrix data 500, the tiles are represented as dots, in which black dots are indicative of memory cells that are occupied (e.g., a bit stored in the memory cell is set to a bit value of 1) and in which white dots are indicative of matrix cells that are unoccupied (or otherwise as a bit value of 0).

In the illustrative embodiment, a column selection 502 is shown in which output from a read-out of the column selection 502 corresponds to data from each row in the matrix along the column. The output is indicative of portions of data for a page read from the compute device 100. Further, a row selection 504 is shown in which output from a read-out of the row selection 504 corresponds to data from each column in the matrix along the row. The output is indicative of portions of data for a page read from the compute device 100. This allows column-major access to occur without need for intermediary matrix transpose operations (e.g., on rows of the matrix).

As a result, the compute device 100 can retrieve a desired subset of data (e.g., in response to a query from an application, by performing, in part, column access operations). More particularly, the compute device 100 may evaluate columns against a reference hyper-dimensional vector to be searched. Rather than iterate through rows of the matrix to find a subset of bit data (e.g., based on a reference hyper-dimensional vector set provided by the application), the compute device 100 may evaluate bit values at a column to determine whether a bit value at a given column index matches a bit value at a corresponding position in the reference hyper-dimensional vector. The compute device 100 may maintain a counter per row indicative of instances in which a column bit value at an index associated with the row matches with a bit value at the corresponding position in the reference hyper-dimensional vector. A row having a relatively high value (e.g., a value that exceeds a specified threshold) can be identified as candidate data that may correspond to the requested subset of data. Further, the compute device 100 may rank the candidate data (i.e., rows) based on the counter associated with the corresponding rows and return the results to the requesting application. Using a value such as a threshold can eliminate the need to continue searching each column, which is advantageous because the reference hyper-dimensional vector is relatively large (e.g., tens of thousands of bits). As a result, search operations for a given subset of data may be processed relatively faster and more efficiently by the compute device 100. Consequently, the identified candidate data serves as a stochastic approximation, which is useful in various cases, such as in instances where an application does not need an exact match for the subset of data, or for data where the closest match within a specified threshold does correspond to the desired subset.

Referring now to FIG. 6, an exemplary conceptual diagram 600 of performing a stochastic associative search on memory is shown. In this example, it is assumed that data is distributed sparsely throughout a matrix 602. Illustratively, a reference hyper-dimensional vector 604 expands to N bits (e.g., about 10,000 bits), which is the same length of the rows in the matrix 602. The matrix 602 also includes M entries as part of a stochastic associative array. The reference hyper-dimensional vector 604 is indicative of reference data having set bits in particular positions therein, represented in FIG. 6 as filled dots. Because the matrix 602 is representative of a sparse matrix, the compute device 100 searches only the columns of the matrix 602 that correspond to positions in the reference hyper-dimensional vector 604 having set bits, as indicated by the dotted rectangles running vertical down from the reference hyper-dimensional vector 604. It should be appreciated that, in some embodiments where zeros are sparse in the reference hyper-dimensional vector, the compute device 100 may search the columns of the matrix that correspond to positions in the reference hyper-dimensional vector having clear bits. Doing so reduces the amount of time spent by the compute device 100 performing a stochastic associative search operation on the data because the compute device 100 does not evaluate every column of the matrix 602. As discussed above, the compute device 100 may maintain a counter to associate with each row that is indicative of a number of matches in column indices associated with the row to the reference hyper-dimensional vector 604. In this case, the compute device 100 identifies, in the sparse matrix 602, two matrices as candidate data (indicated by the one-way arrows pointing to the rows). The two candidate data are associated with five matches and four matches. The compute device 100 may return, to a requesting application, each of the candidate data, a location associated with each data, as well as information relating to the number of matches. An application, in turn, may process such data as needed.

Referring now to FIG. 7, another exemplary conceptual diagram 700 of performing a stochastic associative search on memory is shown. In this example, it is assumed that data is distributed densely throughout a matrix 702. The example may also apply to a situation in which the compute device 100 receives a request to search a specified subset 706 of columns in the matrix. Illustratively, a reference hyper-dimensional vector 704 expands to N bits (e.g., about 10,000 bits), which is the same length of the rows in the matrix 702. The matrix 702 also includes M entries as part of a stochastic associative array. The reference hyper-dimensional vector 704 is indicative of a reference data having set bits in particular positions therein, represented in FIG. 7 as filled dots. In this example, the compute device 100 searches only the specified subset 706 of columns. Doing so reduces the amount of time spent by the compute device 100 performing a stochastic associative search operation on the data because the compute device 100 does not evaluate every column of the matrix 702, in which N can correspond to a relatively large amount of columns (e.g., N can represent over 10,000 bits). As discussed above, the compute device 100 may maintain a counter to associate with each row that is indicative of a number of matches in column indices associated with the row to the reference hyper-dimensional vector 704. In this case, the compute device 100 identifies, in the matrix 702, two matrices as candidate data (indicated by the one-way arrows pointing to the rows). The two candidate data are associated with eight matches and seven matches. The compute device 100 may return, to a requesting application, each of the candidate data, a location associated with each data, as well as information relating to the number of matches. An application, in turn, may process such data as needed.

EXAMPLES

Illustrative examples of the technologies disclosed herein are provided below. An embodiment of the technologies may include any one or more, and any combination of, the examples described below.

Example 1 includes a device comprising a memory media; and a memory controller configured to receive a query from a requestor; determine, in response to receiving the query, a reference hyper-dimensional vector associated with the query; perform a nearest neighbor search by searching columns of a stochastic associative array in the memory media to determine a number of matching bit values for each row relative to the reference hyper-dimensional vector, wherein each bit in a column of the stochastic associative array represents a bit value of a corresponding row; identify a closest matching row that has a highest number of matching bit values; and output data of the closest matching row.

Example 2 includes the subject matter of Example 1, and wherein to perform the nearest neighbor search comprises to search the columns of the stochastic associative array for matching bit values relative to a corresponding bit position of the reference hyper-dimensional vector, wherein each bit in the column of the stochastic associative array represents a bit value of a corresponding row.

Example 3 includes the subject matter of any of Examples 1 and 2, and wherein to identify the closest matching row comprises to identify the closest matching row in the stochastic associative array that has a highest number of matching bit values.

Example 4 includes the subject matter of any of Examples 1-3, and wherein to perform the a nearest neighbor search comprises to search a subset of columns of the stochastic associative array for matching bit values relative to a corresponding bit position of the reference hyper-dimensional vector.

Example 5 includes the subject matter of any of Examples 1-4, and wherein to identify the closest matching row comprises to identify a set of neighbors that have a predefined number of matching values and to transmit the set of neighbors to a host for further evaluation.

Example 6 includes the subject matter of any of Examples 1-5, and wherein the memory controller is further configured to generate a hyper-dimensional vector associated with a key and a hyper-dimensional vector associated with a value to the key by randomly assigning multiple-bit values; perform a hyper-dimensional operation in the memory media to generate a bound hyper-dimensional vector using the hyper-dimensional vector of the key and the hyper-dimensional vector of the value; and storing the bound hyper-dimensional vector in the memory media.

Example 7 includes the subject matter of any of Examples 1-6, and wherein to perform the hyper-dimensional operation comprises to perform a bitwise XOR operation on the hyper-dimensional vector for a key and the hyper-dimensional vector for the value.

Example 8 includes a method comprising receiving, by a memory controller of a compute device, a query from a requestor; determining, in response to receiving the query and by the memory controller, a reference hyper-dimensional vector associated with the query; performing, by the memory controller, a nearest neighbor search by searching columns of a stochastic associative array in the memory; identifying, by the memory controller, a closest matching row in the stochastic associative array relative to the reference hyper-dimensional vector; and outputting, by the memory controller, data of the closest matching row.

Example 9 includes the subject matter of Example 8, and wherein performing the nearest neighbor search comprises searching, by the memory controller, the columns of the stochastic associative array for matching bit values relative to a corresponding bit position of the reference hyper-dimensional vector, wherein each bit in the column of the stochastic associative array represents a bit value of a corresponding row.

Example 10 includes the subject matter of any of Examples 8 and 9, and wherein identifying the closest matching row comprises identifying, by the memory controller, the closest matching row in the stochastic associative array that has a highest number of matching bit values.

Example 11 includes the subject matter of any of Examples 8-10, and wherein performing the a nearest neighbor search comprises searching, by the memory controller, a subset of columns of the stochastic associative array for matching bit values relative to a corresponding bit position of the reference hyper-dimensional vector.

Example 12 includes the subject matter of any of Examples 8-11, and wherein identifying the closest matching row comprises identifying, by the memory controller, a set of neighbors that have a predefined number of matching values and transmitting the set of neighbors to a host for further evaluation.

Example 13 includes the subject matter of any of Examples 8-12, and further including generating, the memory controller, a hyper-dimensional vector associated with a key and a hyper-dimensional vector associated with a value to the key by randomly assigning multiple-bit values; performing, by the memory controller, a hyper-dimensional operation in a memory of the compute device to generate a bound hyper-dimensional vector using the hyper-dimensional vector of the key and the hyper-dimensional vector of the value; and storing, by the memory controller, the bound hyper-dimensional vector in the memory.

Example 14 includes the subject matter of any of Examples 8-13, and wherein performing the hyper-dimensional operation comprises performing a bitwise XOR operation on the hyper-dimensional vector for a key and the hyper-dimensional vector for the value.

Example 15 includes one or more machine-readable storage media comprising a plurality of instructions stored thereon that, in response to being executed, cause a device to receive a query from a requestor; determine, in response to receiving the query, a reference hyper-dimensional vector associated with the query; perform a nearest neighbor search by searching columns of a stochastic associative array in the memory media to determine a number of matching bit values for each row relative to the reference hyper-dimensional vector, wherein each bit in a column of the stochastic associative array represents a bit value of a corresponding row; identify a closest matching row that has a highest number of matching bit values; and output data of the closest matching row.

Example 16 includes the subject matter of Example 15, and wherein to perform the nearest neighbor search comprises to search the columns of the stochastic associative array for matching bit values relative to a corresponding bit position of the reference hyper-dimensional vector, wherein each bit in the column of the stochastic associative array represents a bit value of a corresponding row.

Example 17 includes the subject matter of any of Examples 15 and 16, and wherein to identify the closest matching row comprises to identify the closest matching row in the stochastic associative array that has a highest number of matching bit values.

Example 18 includes the subject matter of any of Examples 15-17, and wherein to perform the a nearest neighbor search comprises to search a subset of columns of the stochastic associative array for matching bit values relative to a corresponding bit position of the reference hyper-dimensional vector.

Example 19 includes the subject matter of any of Examples 15-18, and wherein to identify the closest matching row comprises to identify a set of neighbors that have a predefined number of matching values and to transmit the set of neighbors to a host for further evaluation.

Example 20 includes the subject matter of any of Examples 15-19, and further including a plurality of instructions that in response to being executed cause the device to generate a hyper-dimensional vector associated with a key and a hyper-dimensional vector associated with a value to the key by randomly assigning multiple-bit values; perform a hyper-dimensional operation in the memory media to generate a bound hyper-dimensional vector using the hyper-dimensional vector of the key and the hyper-dimensional vector of the value; and storing the bound hyper-dimensional vector in the memory media.

The invention claimed is:

1. A device comprising:
a memory media; and
a memory controller configured to:
receive a query from a requestor;
determine, in response to receiving the query, a reference hyper-dimensional vector associated with the query;
perform a nearest neighbor search by searching columns of a stochastic associative array in the memory media to determine a number of matching bit values for each row relative to the reference hyper-dimensional vector, wherein each bit in a column of the stochastic associative array represents a bit value of a corresponding row;
identify a closest matching row that has a highest number of matching bit values; and
output data of the closest matching row.

2. The device of claim 1, wherein to perform the nearest neighbor search comprises to search the columns of the stochastic associative array for matching bit values relative to a corresponding bit position of the reference hyper-dimensional vector, wherein each bit in the columns of the stochastic associative array represents a bit value of a corresponding row.

3. The device of claim 2, wherein to identify the closest matching row comprises to identify the closest matching row in the stochastic associative array that has a highest number of matching bit values.

4. The device of claim 1, wherein to perform the a nearest neighbor search comprises to search a subset of columns of the stochastic associative array for matching bit values relative to a corresponding bit position of the reference hyper-dimensional vector.

5. The device of claim 1, wherein to identify the closest matching row comprises to identify a set of neighbors that have a predefined number of matching values and to transmit the set of neighbors to a host for further evaluation.

6. The device of claim 1, wherein the memory controller is further configured to:
generate a hyper-dimensional vector associated with a key and a hyper-dimensional vector associated with a value to the key by randomly assigning multiple-bit values;
perform a hyper-dimensional operation in the memory media to generate a bound hyper-dimensional vector using the hyper-dimensional vector of the key and the hyper-dimensional vector of the value; and
storing the bound hyper-dimensional vector in the memory media.

7. The device of claim 6, wherein to perform the hyper-dimensional operation comprises to perform a bitwise XOR operation on the hyper-dimensional vector for a key and the hyper-dimensional vector for the value.

8. A method comprising:
receiving, by a memory controller of a compute device, a query from a requestor;
determining, in response to receiving the query and by the memory controller, a reference hyper-dimensional vector associated with the query;
performing, by the memory controller, a nearest neighbor search by searching columns of a stochastic associative array in a memory media;
identifying, by the memory controller, a closest matching row in the stochastic associative array relative to the reference hyper-dimensional vector; and
outputting, by the memory controller, data of the closest matching row.

9. The method of claim 8, wherein performing the nearest neighbor search comprises searching, by the memory controller, the columns of the stochastic associative array for matching bit values relative to a corresponding bit position of the reference hyper-dimensional vector, wherein each bit in the columns of the stochastic associative array represents a bit value of a corresponding row.

10. The method of claim 9, wherein identifying the closest matching row comprises identifying, by the memory controller, the closest matching row in the stochastic associative array that has a highest number of matching bit values.

11. The method of claim 8, wherein performing the a nearest neighbor search comprises searching, by the memory controller, a subset of columns of the stochastic associative array for matching bit values relative to a corresponding bit position of the reference hyper-dimensional vector.

12. The method of claim 8, wherein identifying the closest matching row comprises identifying, by the memory controller, a set of neighbors that have a predefined number of matching values and transmitting the set of neighbors to a host for further evaluation.

13. The method of claim 8, further comprising:
generating, the memory controller, a hyper-dimensional vector associated with a key and a hyper-dimensional vector associated with a value to the key by randomly assigning multiple-bit values;
performing, by the memory controller, a hyper-dimensional operation in a memory of the compute device to generate a bound hyper-dimensional vector using the hyper-dimensional vector of the key and the hyper-dimensional vector of the value; and
storing, by the memory controller, the bound hyper-dimensional vector in the memory.

14. The method of claim 13, wherein performing the hyper-dimensional operation comprises performing a bitwise XOR operation on the hyper-dimensional vector for a key and the hyper-dimensional vector for the value.

15. One or more machine-readable storage media comprising a plurality of instructions stored thereon that, in response to being executed, cause a device to:
receive a query from a requestor;
determine, in response to receiving the query, a reference hyper-dimensional vector associated with the query;
perform a nearest neighbor search by searching columns of a stochastic associative array in a memory media to determine a number of matching bit values for each row relative to the reference hyper-dimensional vector, wherein each bit in a column of the stochastic associative array represents a bit value of a corresponding row;
identify a closest matching row that has a highest number of matching bit values; and
output data of the closest matching row.

16. The one or more machine-readable storage media of claim 15, wherein to perform the nearest neighbor search comprises to search the columns of the stochastic associative array for matching bit values relative to a corresponding bit position of the reference hyper-dimensional vector, wherein each bit in the columns of the stochastic associative array represents a bit value of a corresponding row.

17. The one or more machine-readable storage media of claim 16, wherein to identify the closest matching row comprises to identify the closest matching row in the stochastic associative array that has a highest number of matching bit values.

18. The one or more machine-readable storage media of claim 15, wherein to perform the a nearest neighbor search comprises to search a subset of columns of the stochastic associative array for matching bit values relative to a corresponding bit position of the reference hyper-dimensional vector.

19. The one or more machine-readable storage media of claim 15, wherein to identify the closest matching row comprises to identify a set of neighbors that have a predefined number of matching values and to transmit the set of neighbors to a host for further evaluation.

20. The one or more machine-readable storage media of claim 15, further comprising a plurality of instructions that in response to being executed cause the device to:
generate a hyper-dimensional vector associated with a key and a hyper-dimensional vector associated with a value to the key by randomly assigning multiple-bit values;
perform a hyper-dimensional operation in a memory media to generate a bound hyper-dimensional vector using the hyper-dimensional vector of the key and the hyper-dimensional vector of the value; and
storing the bound hyper-dimensional vector in the memory media.

* * * * *